United States Patent
Chung

(10) Patent No.: US 6,870,187 B2
(45) Date of Patent: Mar. 22, 2005

(54) THIN FILM TRANSISTOR ARRAY PANEL AND MANUFACTURING METHOD THEREOF

(75) Inventor: Yi Chung, Youngin-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/800,180

(22) Filed: Mar. 12, 2004

(65) Prior Publication Data

US 2004/0180479 A1 Sep. 16, 2004

(30) Foreign Application Priority Data

Mar. 13, 2003 (KR) .................................. 10-2003-0015773

(51) Int. Cl.$^7$ ............................................... H01L 29/04
(52) U.S. Cl. ............................. 257/59; 257/71; 257/72; 257/296; 257/300; 257/350; 257/88; 438/709; 438/710; 349/43; 349/139
(58) Field of Search .............................. 257/59, 71, 72, 257/296, 300, 350, 88; 438/709, 710; 349/43, 139

(56) References Cited

U.S. PATENT DOCUMENTS

2002/0097349 A1 * 7/2002 Park .............................. 349/38
2003/0223019 A1 * 12/2003 Kim et al. ..................... 349/43

* cited by examiner

Primary Examiner—Matthew Smith
Assistant Examiner—Victor V Yevsikov
(74) Attorney, Agent, or Firm—F. Chau & Associates LLC

(57) ABSTRACT

A thin film transistor array panel is provided, which includes: a substrate; a gate electrode; a gate insulating layer formed on the gate electrode; a polysilicon layer formed on the gate insulating layer and including a pair of ohmic contact areas doped with conductive impurity; source and drain electrodes formed on the ohmic contact areas at least in part; a passivation layer formed on the source and the drain electrodes and having a contact hole exposing the drain electrode at least in part; and a pixel electrode formed on the passivation layer and connected to the drain electrode through the contact hole.

10 Claims, 14 Drawing Sheets

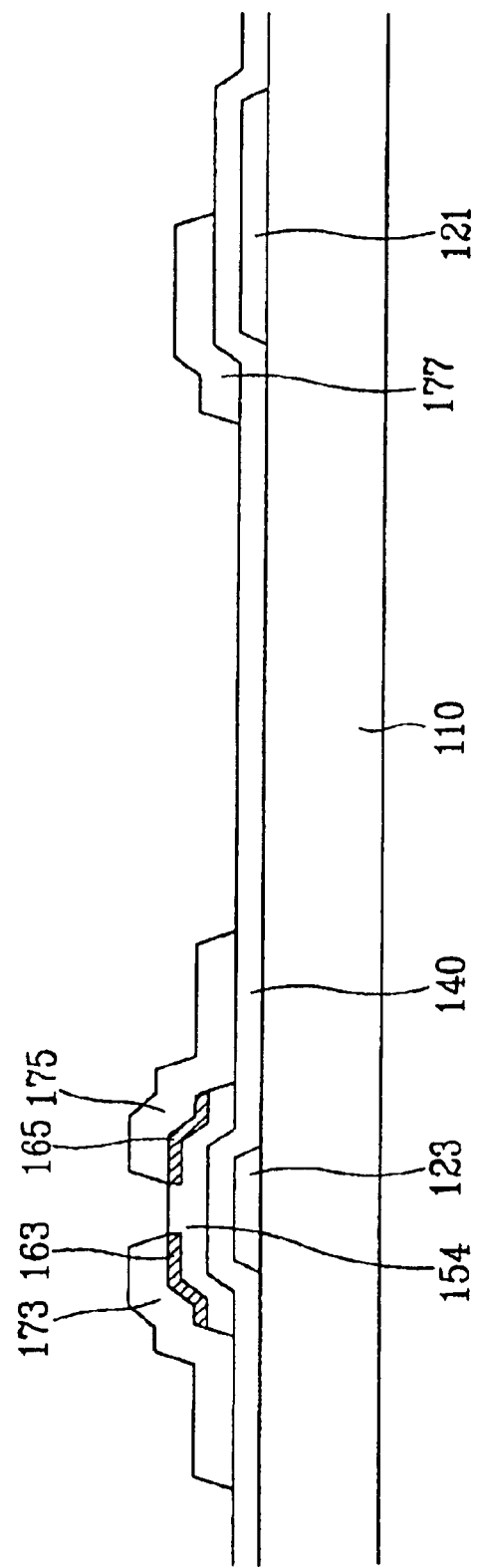

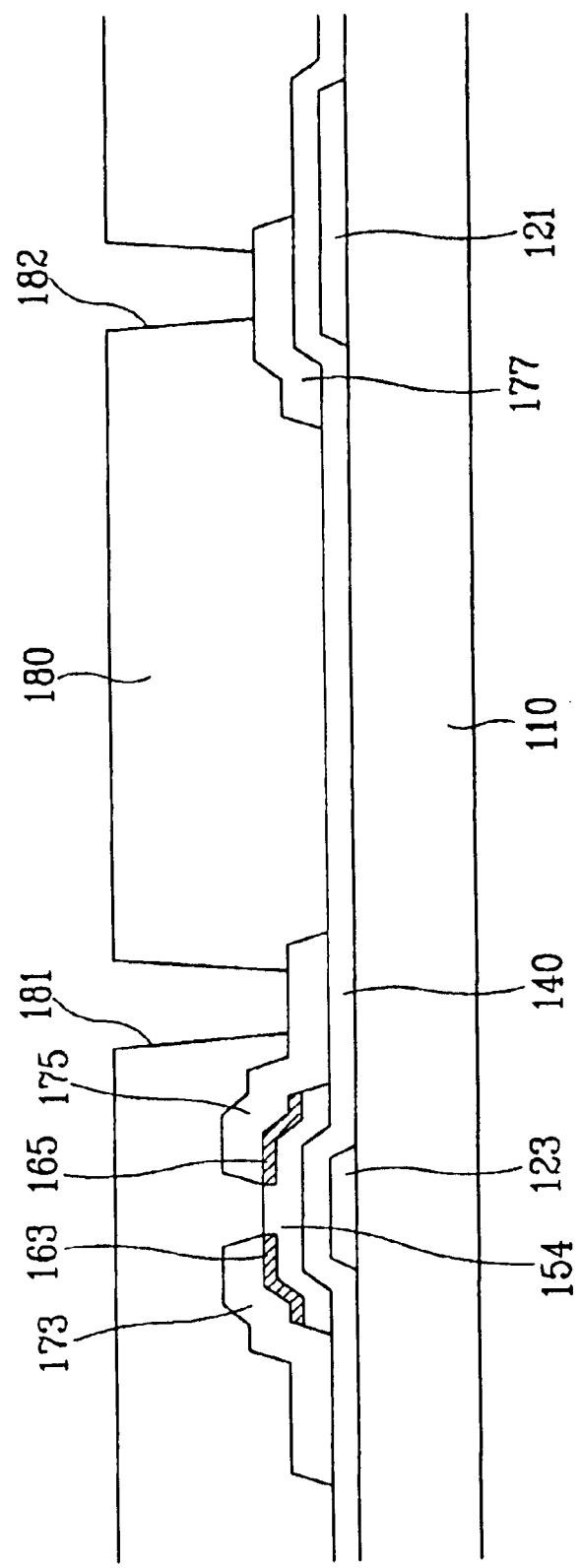

THIN FILM TRANSISTOR ARRAY PANEL AND MANUFACTURING METHOD THEREOF

BACKGROUND OF THE INVENTION (a) Field of the Invention

The present invention relates to a thin film transistor array panel and manufacturing method thereof.

(b) Description of Related Art

A thin film transistor (TFT) array panel is utilized for driving pixels of a display device such as a liquid crystal display (LCD) or an organic electroluminescence (EL) display device. The TFT array panel includes a plurality of gate lines transmitting scanning signals, a plurality of data lines transmitting data signals, a plurality of TFTs connected to the gate lines and the data lines, a plurality of pixel electrode connected to the TFTs, a gate insulating layer covering the gate lines, and a passivation layer covering the data lines. The TFT array panel selectively transmits the data signals to the pixel electrodes in response to the scanning signals. The TFT includes a semiconductor layer made of amorphous silicon or polysilicon.

A conventional method of an amorphous silicon TFT array panel requires several deposition steps and photolithography steps forming the above-described elements. The increase of the number of the steps reduces the productivity and increases the cost of the products. In addition, the amorphous silicon TFT may be inferior to a polysilicon TFT in operation speed.

SUMMARY OF THE INVENTION

A thin film transistor array panel is provided, which includes: a substrate; a gate electrode; a gate insulating layer formed on the gate electrode; a polysilicon layer formed on the gate insulating layer and including a pair of ohmic contact areas doped with conductive impurity; source and drain electrodes formed on the ohmic contact areas at least in part; a passivation layer formed on the source and the drain electrodes and having a contact hole exposing the drain electrode at least in part; and a pixel electrode formed on the passivation layer and connected to the drain electrode through the contact hole.

The conductive impurity may include boron or phosphorous and the concentration of the impurity may range from about $1 \times 10^{14}$ to about $1 \times 10^{16}$.

The thin film transistor array panel may further include: a gate line disposed between the substrate and the gate insulating layer and connected to the gate electrode; and a data line disposed between the gate insulating layer and the passivation layer and connected to the source electrode.

A method of manufacturing a thin film transistor array panel is provided, which includes: forming a gate electrode; depositing a gate insulating layer and a polysilicon layer on the gate electrode in sequence; forming a photoresist having a first portion and a second portion thinner than the first portion on the polysilicon layer; patterning the polysilicon layer using the photoresist as a mask to form a semiconductor layer; removing the second portion of the photoresist; performing impurity implantation using the first portion of the photoresist as a mask to form ohmic contact areas in the semiconductor layer; removing the first portion of the photoresist; forming source and drain electrodes on the ohmic contact areas; forming a passivation layer having a contact hole on the drain electrode; and forming a pixel electrode on the passivation layer.

The formation of the photoresist may include: coating a photoresist film on the polysilicon layer; exposing the photoresist film through a photo-mask having a slit pattern or a translucent portion facing the second portion of the photoresist; and developing the photoresist film to form the photoresist.

The impurity may include p type conductive impurity.

BRIEF DESCRIPTION OF THE DRAWINGS

The present invention will become more apparent by describing embodiments thereof in detail with reference to the accompanying drawings in which:

FIG. 7B is a sectional view of the TFT array panel shown in FIG. 5A taken along the line VIIB–VIIB';

FIG. 8B is a sectional view of the TFT array panel shown in FIG. 8A taken along the line VIIIB–VIIIB'.

DETAILED DESCRIPTION OF EMBODIMENTS

Figure 1A:
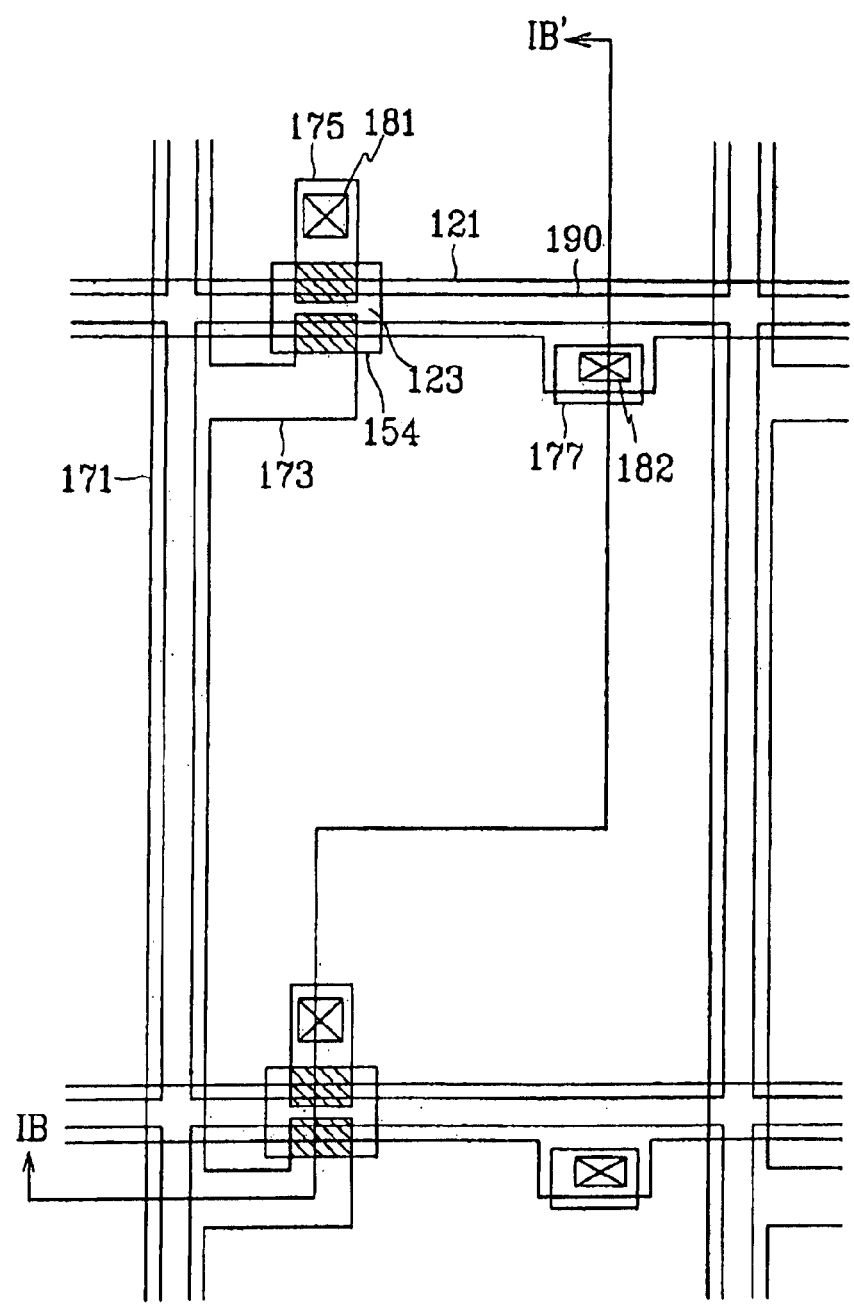
FIG. 1A is a layout view of a TFT array panel according to an embodiment of the present invention.

The present invention now will be described more fully hereinafter with reference to the accompanying drawings, in which embodiments of the invention are shown. The present invention may, however, be embodied in many different forms and should not be construed as limited to the embodiments set forth herein.

In the drawings, the thickness of layers, films and regions are exaggerated for clarity. Like numerals refer to like elements throughout. It will be understood that when an element such as a layer, film, region or substrate is referred to as being "on" another element, it can be directly on the other element or intervening elements may also be present. In contrast, when an element is referred to as being "directly on" another element, there are no intervening elements present.

Now, thin film transistor arrays according to embodiments of the present invention will be described with reference to the accompanying drawings.

A TFT array panel according to an embodiment of the present invention is described in detail with reference to FIGS. 1A and 1B.

Figure 1B:
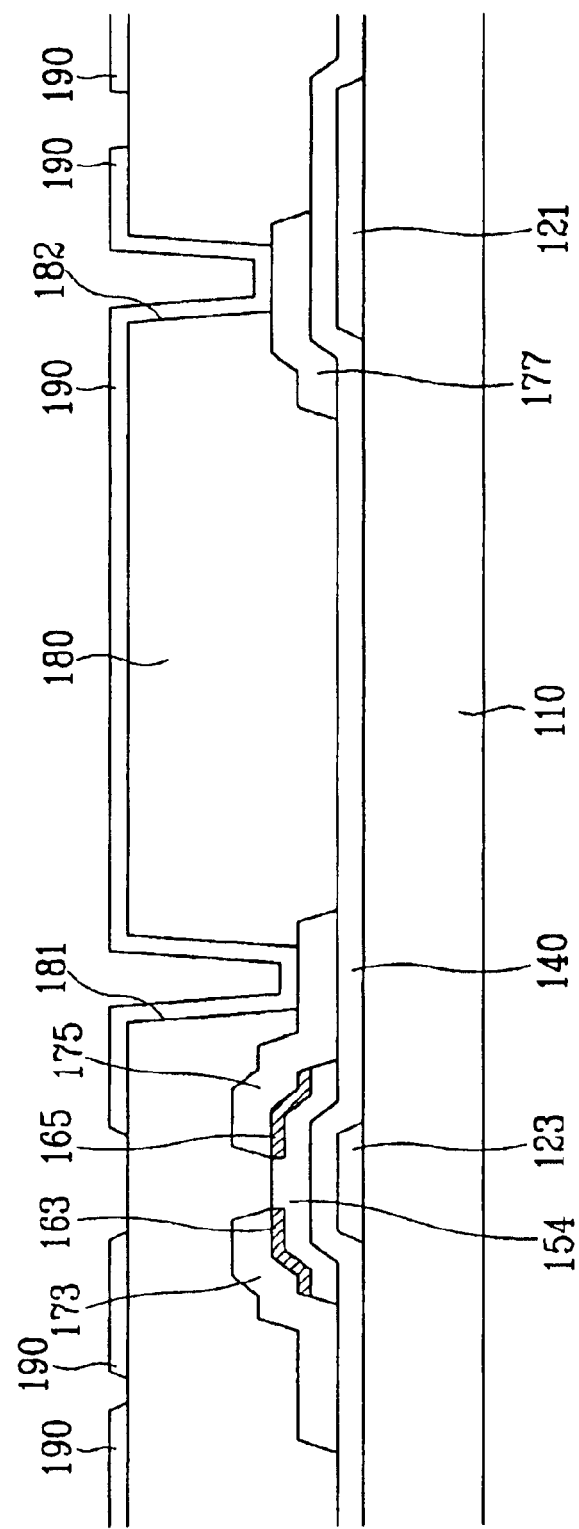
FIG. 1B is a sectional view of the TFT array panel shown in FIG. 1A taken along the line IB–IB'.

FIG. 1A is a layout view of a TFT array panel according to an embodiment of the present invention and FIG. 1B is a sectional view of the TFT array panel shown in FIG. 1A taken along the line IB–IB'.

A plurality of gate lines 121 for transmitting gate signals and a gate shorting bar extending substantially in a longitudinal direction are formed on an insulating substrate 110. Each gate line 121 extends substantially in a transverse direction and a plurality of portions of each gate line 121 form a plurality of gate electrodes 123. Each gate line 121 includes a plurality of projections protruding downward and it may have an expansion having wider width for contact with another layer or an external device.

The gate lines 121 is preferably made of Al containing metal such as Al and Al alloy, Ag containing metal such as Ag and Ag alloy, Cu containing metal such as Cu and Cu alloy, Cr, Mo, Mo alloy, Ta and Ti. The gate lines 121 may include two films having different physical characteristics, a lower film and an upper film. The upper film is preferably made of low resistivity metal including Al containing metal such as Al and Al alloy for reducing signal delay or voltage drop in the gate lines 121. On the other hand, the lower film is preferably made of material such as Cr, Mo, Mo alloy, Ta and Ti, which has good physical, chemical, and electrical contact characteristics with other materials such as indium tin oxide (ITO) and indium zinc oxide (IZO). A good exemplary combination of the lower film material and the upper film material is Cr and Al—Nd alloy.

In addition, the lateral sides of the gate lines 121 are tapered, and the inclination angle of the lateral sides with respect to a surface of the substrate 110 ranges about 30–80 degrees.

A gate insulating layer 140 preferably made of silicon nitride (SiNx) is formed on the gate lines 121.

A plurality of semiconductor islands 154 preferably made of polysilicon are formed on the gate insulating layer 140 opposite the gate electrodes 123. Each semiconductor island 154 includes a pair of ohmic contact areas 163 and 165 doped with n type or p type impurity such as boron (B) and phosphorous (P) at the top surfaces and are separated from each other.

The lateral sides of the semiconductor islands 154 are tapered, and the inclination angles thereof are preferably in a range between about 30–80 degrees.

A plurality of data lines 171, a plurality of drain electrodes 175, and a plurality of storage capacitor conductors 177 are formed on the ohmic contacts 161 and 165 and the gate insulating layer 140.

The data lines 171 for transmitting data voltages extend substantially in the longitudinal direction and intersect the gate lines 121. Each data line 171 may include an expansion having wider width for contact with another layer or an external device.

A plurality of branches of each data line 171, which project toward the drain electrodes 175, form a plurality of source electrodes 173. Each pair of the source electrodes 173 and the drain electrodes 175 are separated from each other and opposite each other with respect to a gate electrode 123. A gate electrode 123, a source electrode 173, and a drain electrode 175 along with a semiconductor island 154 form a TFT having a channel formed in the semiconductor island 154 disposed between the source electrode 173 and the drain electrode 175.

The storage capacitor conductors 177 overlap the projections of the gate lines 121.

The data lines 171, the drain electrodes 175, and the storage capacitor conductors 177 are preferably made of refractory metal such as Mo, Mo alloy or Cr. However, they may further include an additional film located thereon and preferably made of Al containing metal or Ag containing metal.

Like the gate lines 121, the data lines 171, the drain electrodes 175, and the storage capacitor conductors 177 have tapered lateral sides, and the inclination angles thereof range about 30–80 degrees.

The ohmic contact areas 163 and 165 reduce the contact resistance between the underlying semiconductor islands 154 and the overlying data lines 171 and the overlying drain electrodes 175. The semiconductor islands 154 include a plurality of exposed portions, which are not covered with the data lines 171 and the drain electrodes 175, such as portions located between the source electrodes 173 and the drain electrodes 175.

A passivation layer 180 is formed on the data lines 171, the drain electrodes 175, the storage conductors 177, and the exposed portions of the semiconductor islands 154. The passivation layer 180 is preferably made of photosensitive organic material having a good flatness characteristic, low dielectric insulating material having dielectric constant lower than 4.0 such as a-Si:C:O and a-Si:O:F formed by plasma enhanced chemical vapor deposition (PECVD), or inorganic material such as silicon nitride.

The passivation layer 180 has a plurality of contact holes 181 and 182 exposing the drain electrodes 175 and the storage conductors 177. The passivation layer 180 may further have a plurality of contact holes (not shown) exposing the expansions of the data lines 171. The passivation layer 180 and the gate insulating layer 140 may have a plurality of contact holes (not shown) exposing the expansions of the gate lines 121.

A plurality of pixel electrodes 190 and, preferably, a plurality of contact assistants (not shown), which are preferably made of ITO or IZO, are formed on the passivation layer 180.

The pixel electrodes 190 are physically and electrically connected to the drain electrodes 175 through the contact holes 181 and to the storage capacitor conductors 177 through the contact holes 182 such that the pixel electrodes 190 receive the data voltages from the drain electrodes 175 and transmit the received data voltages to the storage capacitor conductors 177.

The pixel electrodes 190 supplied with the data voltages generate electric fields in cooperation with a common electrode (not shown) on another panel (not shown), which reorient liquid crystal molecules in a liquid crystal layer (not shown) disposed therebetween.

A pixel electrode 190 and a common electrode form a liquid crystal capacitor, which stores applied voltages after turn-off of the TFT. An additional capacitor called a "storage capacitor," which is connected in parallel to the liquid crystal capacitor, is provided for enhancing the voltage storing capacity. The storage capacitors are implemented by overlapping the pixel electrodes 190 with the gate lines 121 adjacent thereto (called "previous gate lines"). The capacitances of the storage capacitors, i.e., the storage capacitances are increased by providing the projections at the gate lines 121 for increasing overlapping areas and by providing the storage capacitor conductors 177, which are connected to the pixel electrodes 190 and overlap the projections, under the pixel electrodes 190 for decreasing the distance between the terminals.

The pixel electrodes 190 overlap the gate lines 121 and the data lines 171 to increase aperture ratio but it is optional.

The contact assistants are connected to the exposed expansions of the gate lines 121 and the exposed expansions of the data lines 171 through the contact holes. The contact assistants protect the exposed portions and complement the adhesiveness of the exposed portions and external devices.

A method of manufacturing the TFT array panel shown in FIGS. 1A and 1B according to an embodiment of the present invention will be now described in detail with reference to FIGS. 2A to 8B as well as FIGS. 1A and 1B.

FIGS. 2A, 5A, 6A, 7A and 8A are layout views of the TFT array panel shown in FIGS. 1A and 1B in intermediate steps of a manufacturing method thereof according to an embodiment of the present invention, and FIGS. 2B, 5B, 6B, 7B and 8B are sectional views of the TFT array panel shown in FIGS. 2A, 5A, 6A, 7A and 8A taken along the lines IIB–IIB', VB–VB', VIB–VIB', VIIB–VIIB', and VIIIB–VIIIB', respectively.

Figure 2A:
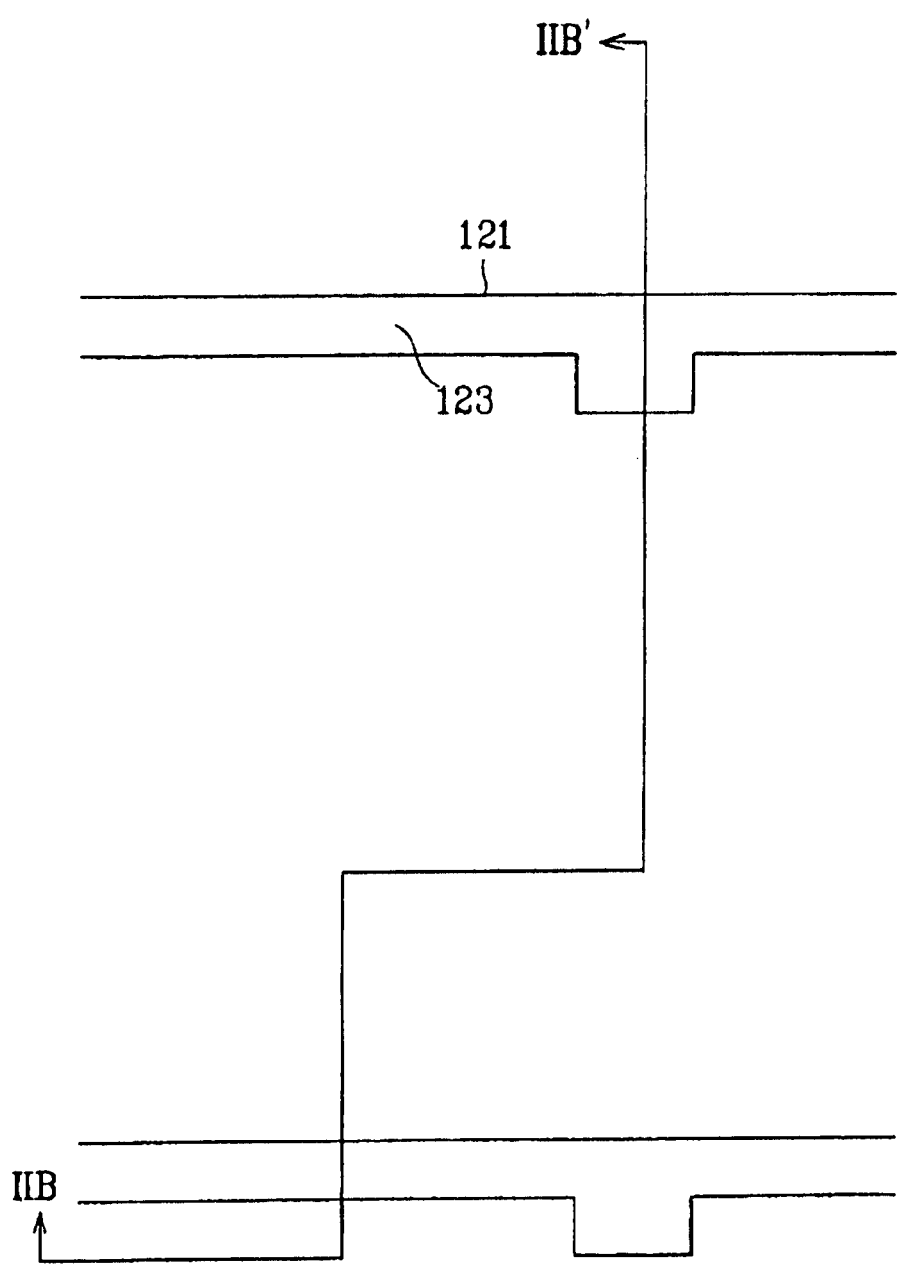
FIG. 2A is a layout view of a TFT array panel shown in FIGS. 1A and 1B in an initial step of a manufacturing method thereof according to an embodiment of the present invention.
Figure 2B:
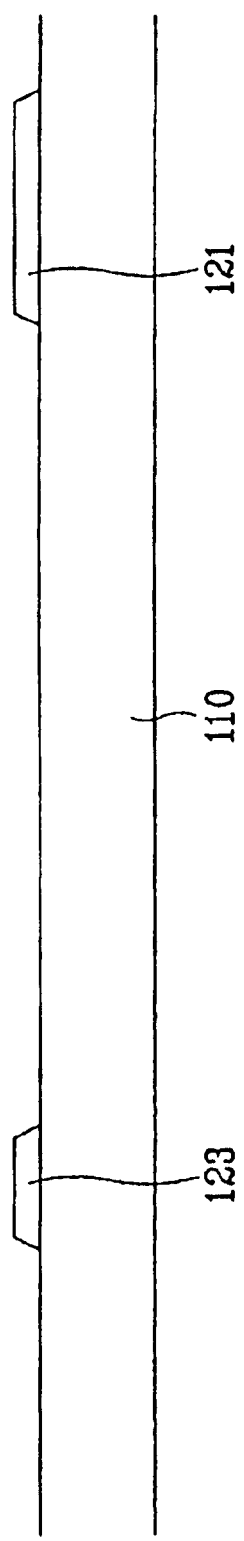
FIG. 2B is a sectional view of the TFT array panel shown in FIG. 2A taken along the line IIB–IIB'.

Referring to FIGS. 2A and 2B, a (plurality of) conductive film(s) preferably made of Al, Cr or Mo is sputtered on an insulating substrate 110 such as transparent glass. The conductive film is patterned to form a plurality of gate lines 121 including a plurality of gate electrodes 123. Inclined lateral surfaces of the gate lines 121 facilitate the attachment of following films to the gate lines 121.

Figure 3:
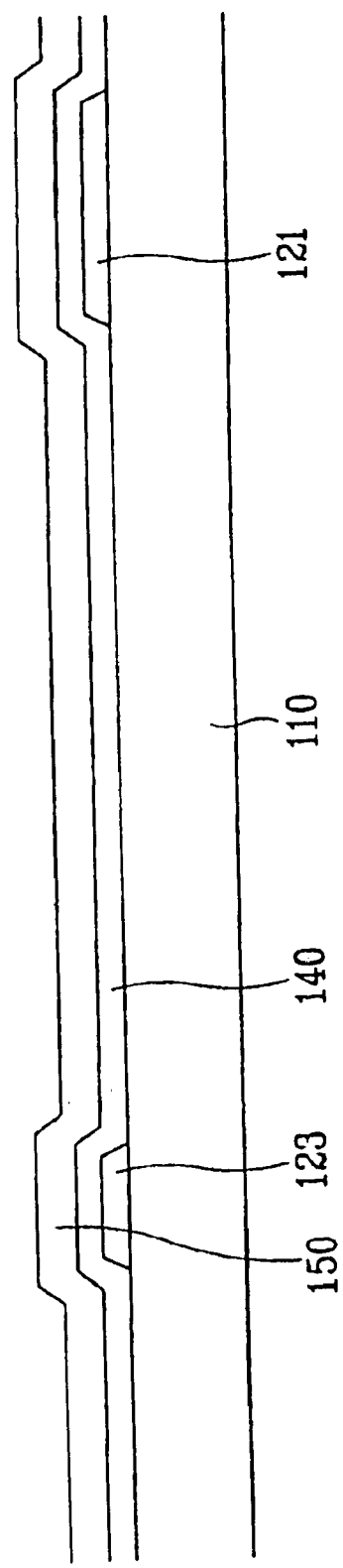
FIG. 3 is a sectional view of the TFT array panel shown in FIG. 2A taken along the line IIB–IIB' in a step following the step shown in FIG. 2B.

Referring to FIG. 3, a gate insulating layer 140 is sequentially deposited on the gate lines 121 and the substrate 110. The gate insulating layer 140 is preferably made of silicon dioxide ($SiO_2$) or silicon nitride (SiNx).

Next, an amorphous silicon layer is deposited and heat-treated with laser or furnace to form a polysilicon layer 150. The polysilicon layer 150 may be formed by directly depositing polysilicon.

Figure 4:
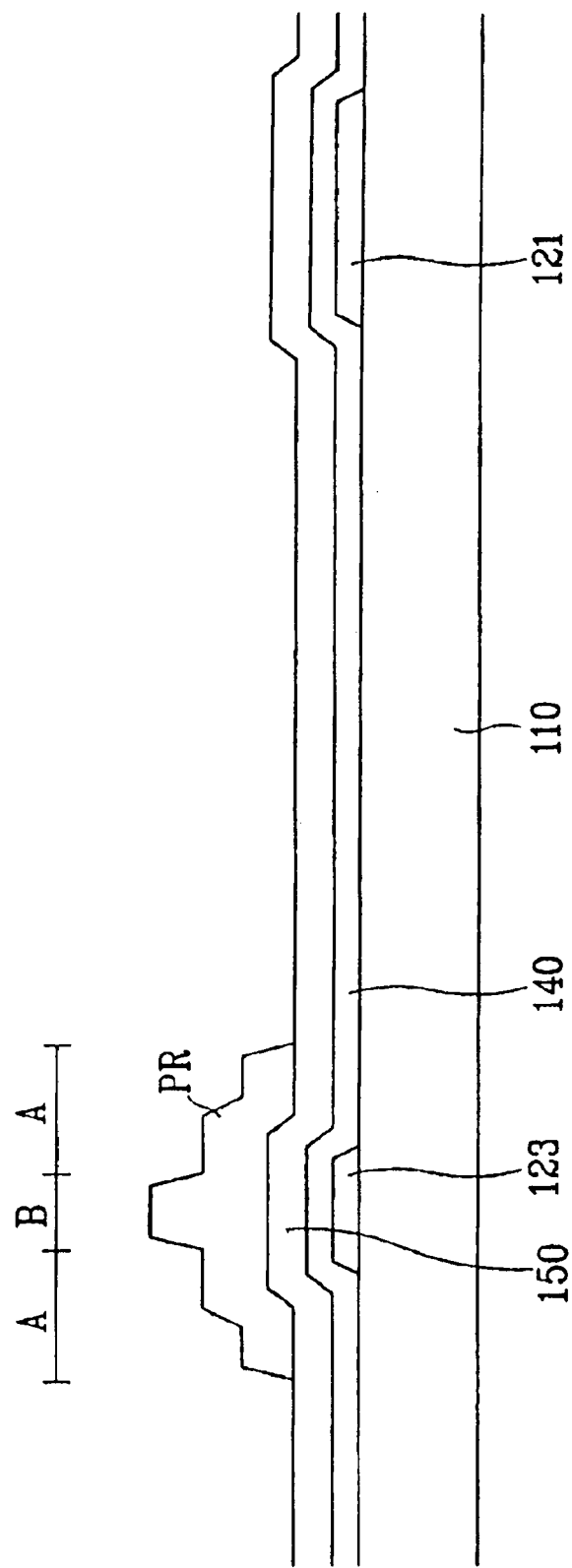
FIG. 4 is a sectional view of the TFT array panel shown in FIG. 2A taken along the line IIB–IIB' in a step following the step shown in FIG. 3.

Referring to FIG. 4, a photoresist film is coated on the polysilicon layer 150 and exposed to a photo-mask and developed to form a photoresist PR having position dependent thickness. The photoresist PR shown in FIG. 4 includes a plurality of first and second portions with decreased thickness. The first portions are located on channel areas B and the second portions are located on contact areas A are indicated.

The position-dependent thickness of the photoresist is obtained by several techniques, for example, by providing translucent areas on the exposure mask as well as transparent areas and light blocking opaque areas. The translucent areas may have a slit pattern, a lattice pattern, a thin film(s) with intermediate transmittance or intermediate thickness. When using a slit pattern, It is preferable that the width of the slits or the distance between the slits is smaller than the resolution of a light exposer used for the photolithography. Another example is to use reflowable photoresist. In detail, once a photoresist pattern made of a reflowable material is formed by using a normal exposure mask only with transparent areas and opaque areas, it is subject to reflow process to flow onto areas without the photoresist, thereby forming thin portions.

Figure 5A:
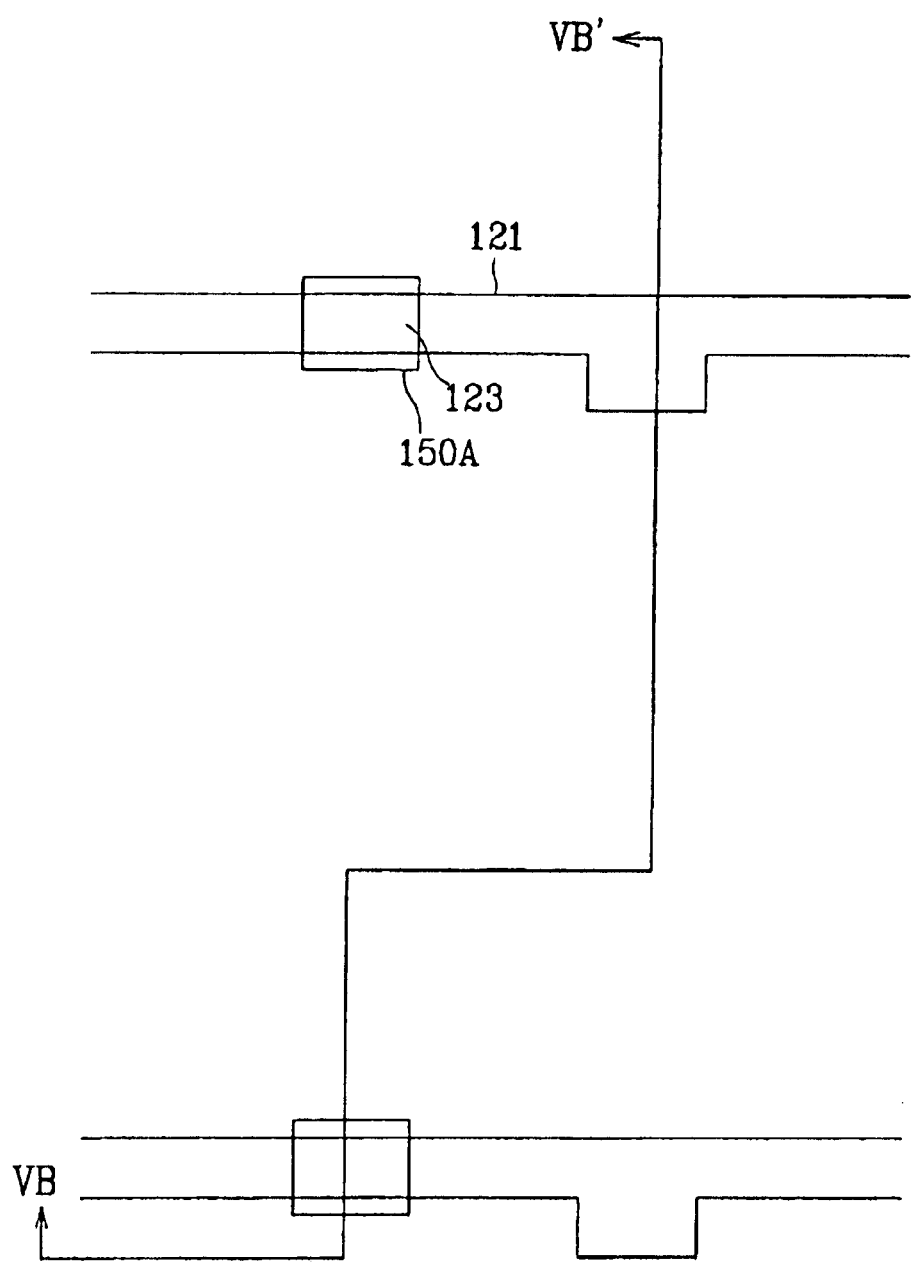
FIG. 5A is a layout view of the TFT array panel shown in FIGS. 1A and 1B in a step following the step shown in FIG. 4.
Figure 5B:
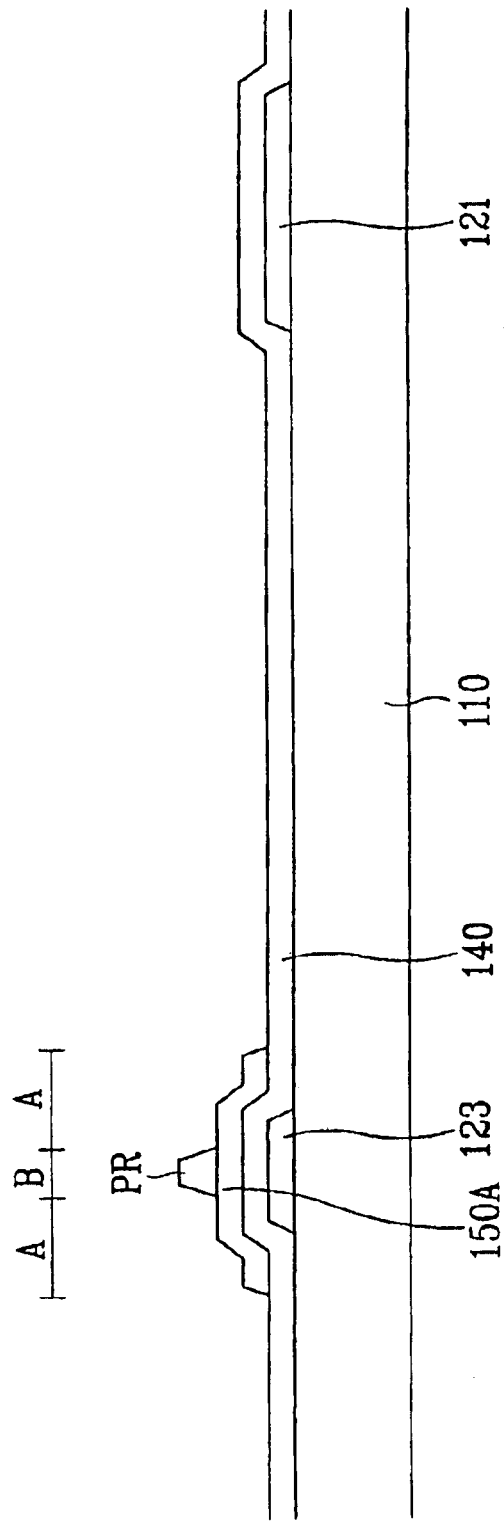
FIG. 5B is a sectional view of the TFT array panel shown in FIG. 5A taken along the line VB–VB'.

Referring to FIGS. 5A and 5B, the polysilicon layer 150 is patterned by using the photoresist PR as an etch mask to form a plurality of semiconductor islands 150A. The second portions of the photoresist PR on the contact areas A are removed by ashing. At this time, the thickness of the first portions of the photoresist PR may be decreased.

Figure 6A:
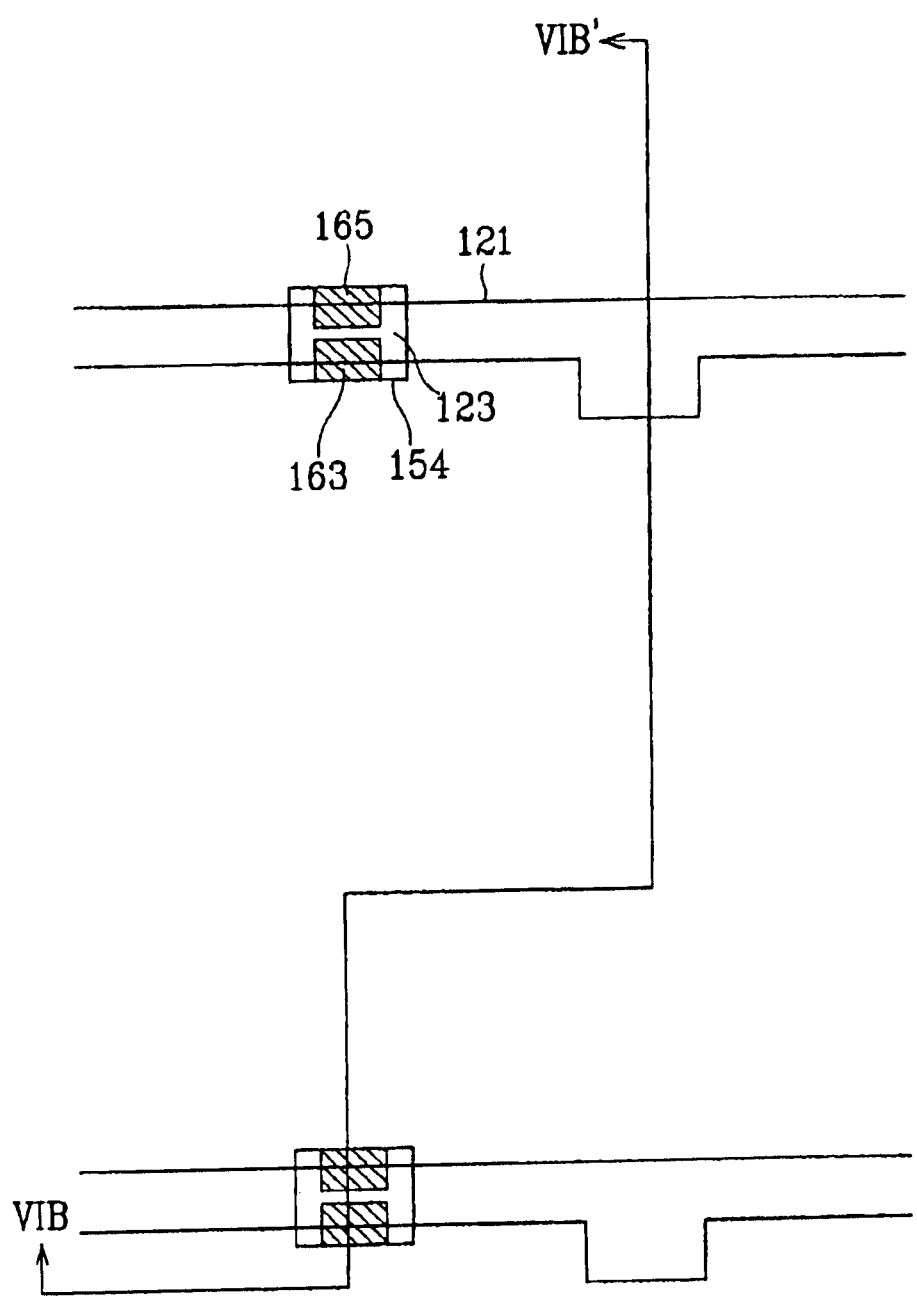
FIG. 6A is a layout view of the TFT array panel shown in FIGS. 1A and 1B in a step following the step shown in FIGS. 5A and 5B.
Figure 6B:
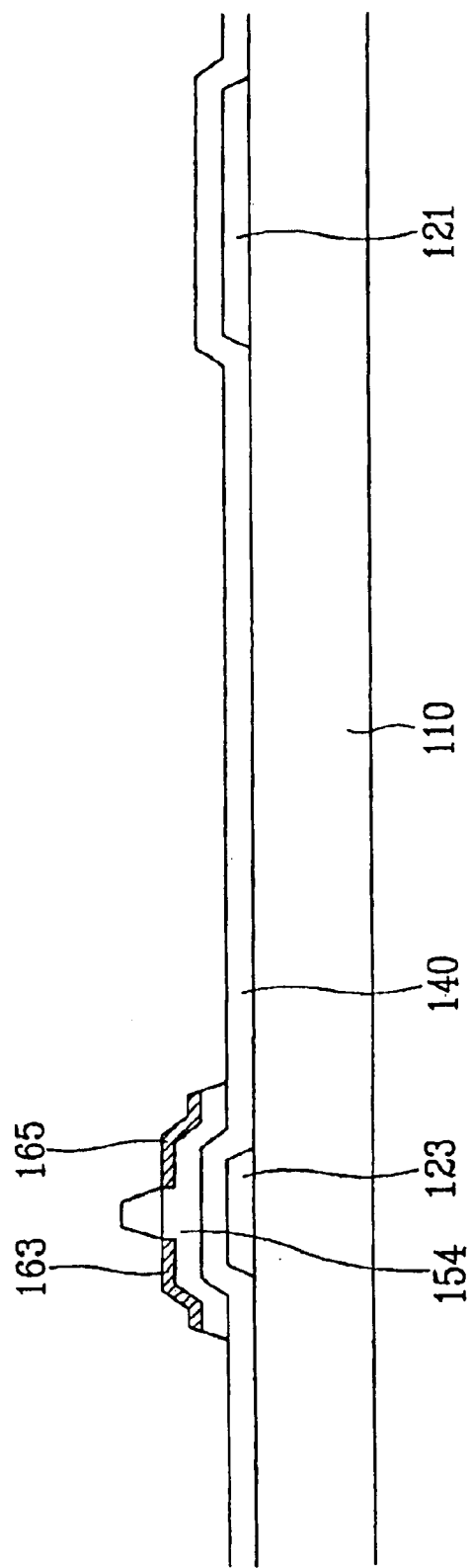
FIG. 6B is a sectional view of the TFT array panel shown in FIG. 6A taken along the line VIB–VIB'.

Referring to FIGS. 6A and 6B, a plurality of ohmic contact areas 163 and 165 are formed by implanting impurity into exposed portions of the polysilicon layer 150A using the first portions of the photoresist PR as an implant mask. The concentration of the impurity is preferably equal to about $1 \times 10^{14}$ to about $1 \times 10^{16}$.

Figure 7A:
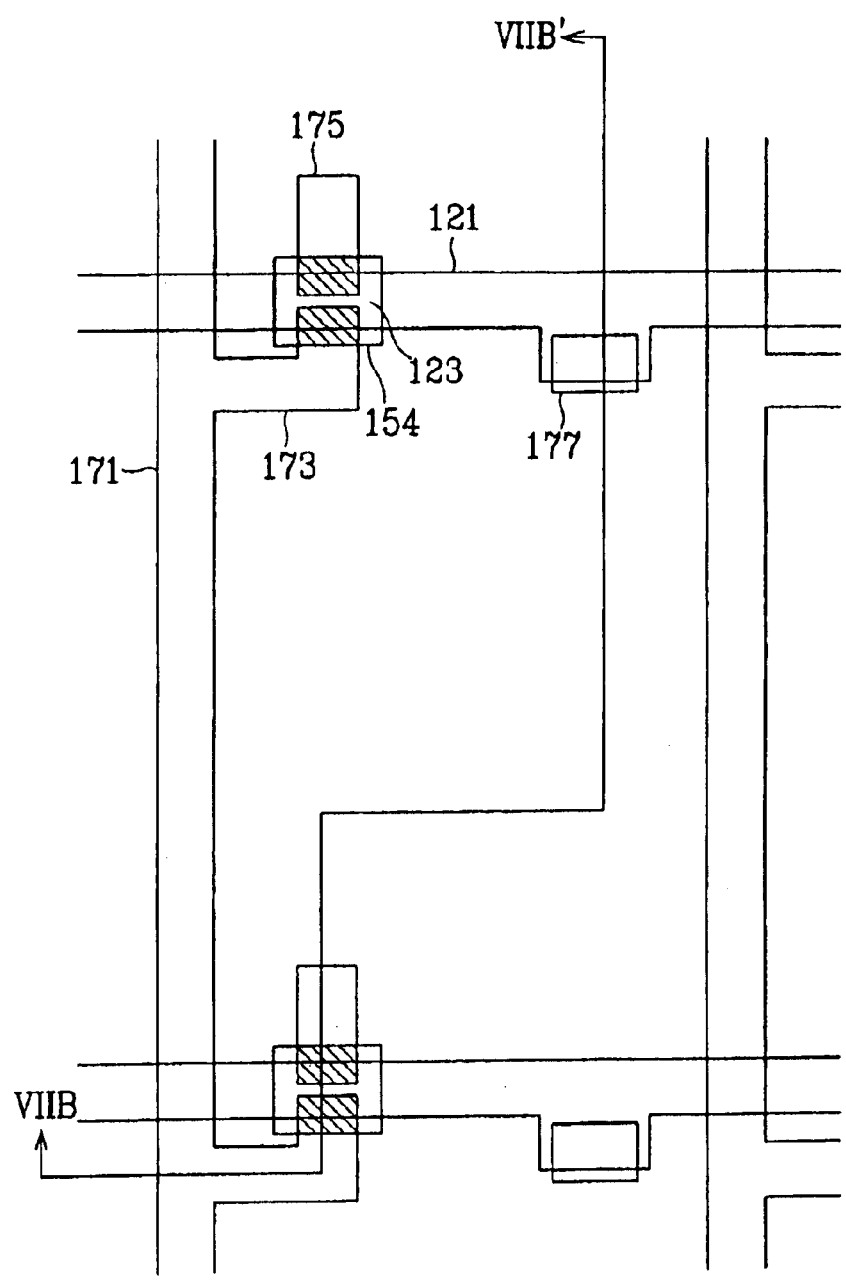
FIG. 7A is a layout view of the TFT array panel shown in FIGS. 1A and 1B in a step following the step shown in FIGS. 6A and 6B.

Referring to FIGS. 7A and 7B, after the first portions of the photoresist PR are removed, a (plurality of) conductive film(s) preferably made of Al, Cr or Mo is sputtered and patterned to form a plurality of data lines 171 including a plurality of source electrodes 173, a plurality of drain electrodes, and a plurality of storage capacitor conductors 177.

Figure 8A:
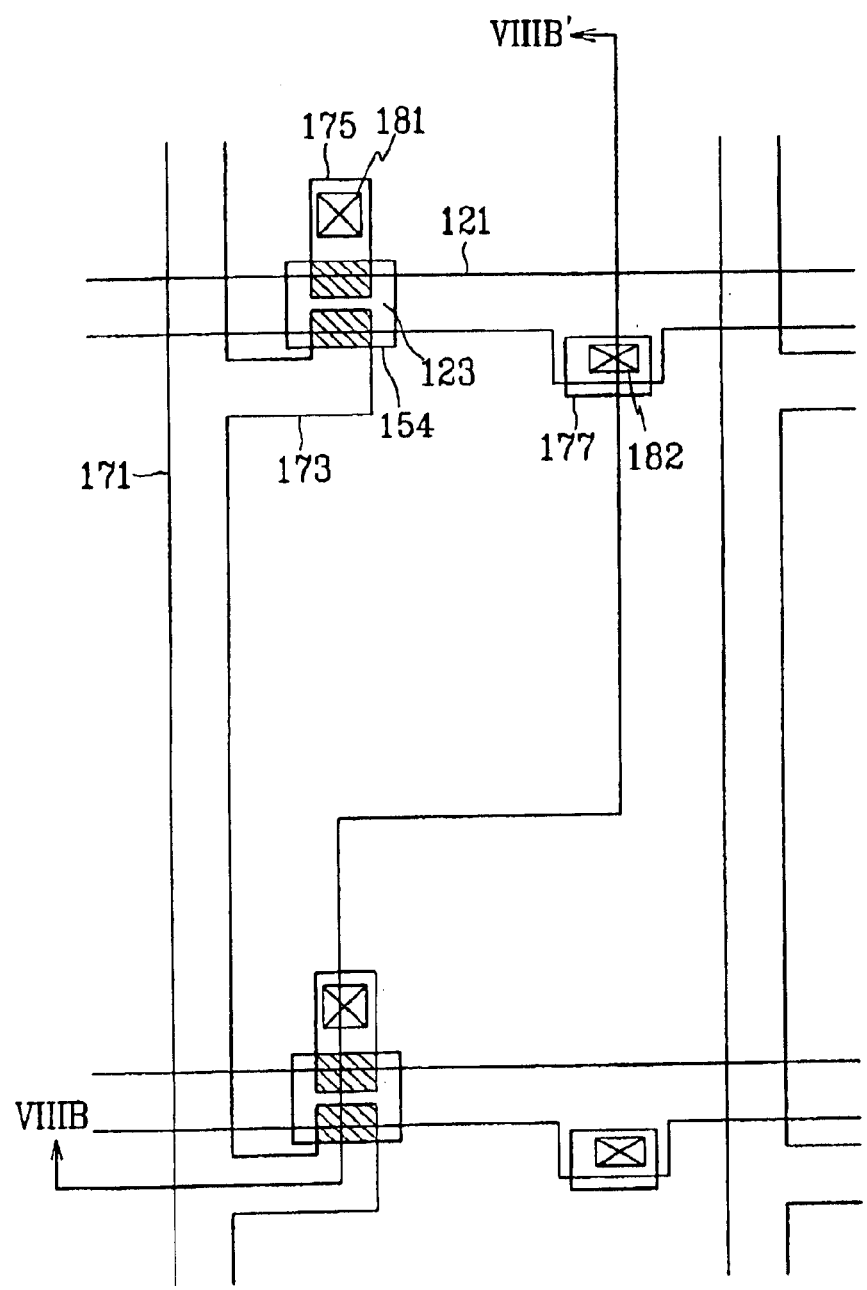
FIG. 8A is a layout view of the TFT array panel shown in FIGS. 1A and 1B in a step following the step shown in FIGS. 7A and 7B.

Referring to FIGS. 8A and 8B, a passivation layer 180 preferably made of inorganic material such as silicon nitride or low dielectric organic insulating material is deposited and patterned along with the gate insulating layer 140 to form a plurality of contact holes 181 and 182. The passivation layer 180 may include two or more films.

Finally, as shown in FIGS. 1A and 1B, a plurality of pixel electrodes 190 and a plurality of contact assistants (not shown) are formed on the passivation layer 180 by sputtering and photo-etching an ITO or IZO layer.

The polysilicon channel layer improves characteristics of the TFTs and the use of the photoresist having a position dependent thickness simplifies the manufacturing process.

While the present invention has been described in detail with reference to the preferred embodiments, those skilled in the art will appreciate that various modifications and substitutions can be made thereto without departing from the spirit and scope of the present invention as set forth in the appended claims.

What is claimed is:

1. A thin film transistor array panel comprising:
   a substrate;
   a gate electrode;
   a gate insulating layer formed on the gate electrode;
   a polysilicon layer formed on the gate insulating layer and including a pair of ohmic contact areas doped with conductive impurity;
   source and drain electrodes formed on the ohmic contact areas at least in part;
   a storage conductor formed on the gate insulating layer overlapping a portion of a gate line formed on the substrate;
   a passivation layer formed on the source and the drain electrodes and having a first contact hole exposing the drain electrode at least in part and a second contact hole exposing the storage conductor; and
   a pixel electrode formed on the passivation layer and connected to the drain electrode and the storage conductor through the first contact hole and the second contact hole, respectively.

2. The thin film transistor array panel of claim 1, wherein the conductive impurity comprises boron or phosphorous.

3. The thin film transistor array panel of claim 1, wherein concentration of the impurity ranges from about $1 \times 10^4$ to about $1 \times 10^{16}$.

4. The thin film transistor array panel of claim 1, wherein the gate line is disposed between the substrate and the gate insulating layer and is connected to the gate electrode; and the thin film transistor array panel further comprises a data line disposed between the gate insulating layer and the passivation layer and connected to the source electrode.

5. A method of manufacturing a thin film transistor array panel, the method comprising:

forming a gate electrode;

depositing a gate insulating layer and a polysilicon layer on the gate electrode in sequence;

forming a photoresist having a first portion and a second portion thinner than the first portion on the polysilicon layer;

patterning the polysilicon layer using the photoresist as a mask to form a semiconductor layer;

removing the second portion of the photoresist;

performing impurity implantation using the first portion of the photoresist as a mask to form ohmic contact areas in the semiconductor layer;

removing the first portion of the photoresist;

forming source and drain electrodes on the ohmic contact areas;

forming a passivation layer having a contact hole on the drain electrode; and forming a pixel electrode on the passivation layer.

6. The method of claim 5, wherein the formation of the photoresist comprising:

coating a photoresist film on the polysilicon layer;

exposing the photoresist film through a photo-mask having a slit pattern or a translucent portion facing the second portion of the photoresist; and developing the photoresist film to form the photoresist.

7. The method of claim 5, wherein the impurity comprises p type conductive impurity.

8. The method of claim 5, wherein the first portion of the photoresist is positioned over a middle portion of the gate electrode and the second portion of the photoresist is positioned over end portions of the gate electrode.

9. The method of claim 8, wherein the second portion of the photoresist Is further positioned over areas adjacent to the end portions of the gate electrode.

10. A method of manufacturing a thin film transistor array panel, the method comprising:

forming a gate electrode;

depositing a gate insulating layer and a polysilicon layer on the gate electrode in sequence;

forming a photoresist having a first portion and a second portion thinner than the first portion on the polysilicon layer, wherein the first portion of the photoresist is positioned over a middle portion of the gate electrode and the second portion of the photoresist is positioned over end portions of the gate electrode, patterning the polysilicon layer using the photoresist as a mask to form a semiconductor layer;

removing the second portion of the photoresist;

performing impurity implantation using the first portion of the photoresist as a mask to form ohmic contact areas in the semiconductor layer; and removing the first portion of the photoresist.

* * * * *